(12) United States Patent
Park

(10) Patent No.: US 12,127,423 B2
(45) Date of Patent: Oct. 22, 2024

(54) FLEXIBLE DISPLAY APPARATUS

(71) Applicant: Samsung Display Co., Ltd., Yongin-si (KR)

(72) Inventor: Sungun Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 18 days.

(21) Appl. No.: 17/381,721

(22) Filed: Jul. 21, 2021

(65) Prior Publication Data

US 2021/0351375 A1    Nov. 11, 2021

Related U.S. Application Data

(63) Continuation of application No. 16/420,494, filed on May 23, 2019, now Pat. No. 11,094,912, which is a
(Continued)

(30) Foreign Application Priority Data

Jul. 5, 2016    (KR) .......................... 10-2016-0085073

(51) Int. Cl.
*H10K 50/842* (2023.01)
*H10K 50/86* (2023.01)
(Continued)

(52) U.S. Cl.
CPC ....... *H10K 50/8426* (2023.02); *H10K 59/121* (2023.02); *H10K 59/352* (2023.02);
(Continued)

(58) Field of Classification Search
CPC ............... H01L 51/5246; H01L 51/525; H01L 27/3211; H01L 27/3213; H01L 27/3216;
(Continued)

(56) References Cited

U.S. PATENT DOCUMENTS 7,796,233 B2    9/2010    Park et al.
8,232,575 B2    7/2012    Lee et al.
(Continued)

FOREIGN PATENT DOCUMENTS

JP    2009115933 A    *    5/2009
JP    2013-122471         6/2013
(Continued)

OTHER PUBLICATIONS

Yamagata et al, Liquid Crystal Display Device and Method of Manufacturing the Same, May 2009, pp. 1-14.*

*Primary Examiner* — Latanya N Crawford Eason
(74) *Attorney, Agent, or Firm* — KILE PARK REED & HOUTTEMAN PLLC

(57) ABSTRACT

A flexible display apparatus includes a substrate, a thin film encapsulation layer, a plurality of spacers, and at least one layer of a blocking dam in the non-display region. The substrate includes a display region having a plurality of pixels and a non-display region adjacent to the display region. The thin film encapsulation layer is over the substrate. The spacers are between the substrate and the thin film encapsulation layer and are arranged around a pixel region. A different arrangement of spacers are in a center region and an edge region of the display region. The different arrangement may correspond to at least one of a size and a number of the spacers.

17 Claims, 8 Drawing Sheets

Related U.S. Application Data continuation of application No. 15/598,796, filed on May 18, 2017, now Pat. No. 10,326,102.

(51) Int. Cl.
  *H10K 59/121* (2023.01)
  *H10K 59/35* (2023.01)
  *H10K 59/40* (2023.01)
  *H10K 77/10* (2023.01)
  *H10K 102/00* (2023.01)

(52) U.S. Cl.
  CPC ............ *H10K 77/111* (2023.02); *H10K 50/86* (2023.02); *H10K 59/40* (2023.02); *H10K 2102/311* (2023.02); *Y02E 10/549* (2013.01)

(58) Field of Classification Search
  CPC ............... H01L 27/3218; H01L 27/326; H01L 51/5281; H01L 51/0097; H10K 50/8426; H10K 59/121; H10K 59/352; H10K 77/111; H10K 50/86; H10K 59/40; H10K 2102/311; Y02E 10/549
  See application file for complete search history.

(56) References Cited

U.S. PATENT DOCUMENTS

| | | | |
|---|---|---|---|
| 8,368,056 | B2 | 2/2013 | Lee |
| 8,441,188 | B2 | 5/2013 | Lee |
| 8,736,156 | B2 | 5/2014 | Kwon et al. |
| 9,105,871 | B2 | 8/2015 | Hamm |
| 11,094,912 | B2* | 8/2021 | Park .................... H10K 50/8426 |
| 2004/0021819 | A1* | 2/2004 | Kadotani ............ G02F 1/13394 349/155 |
| 2005/0219456 | A1 | 10/2005 | Tadaki et al. |
| 2009/0046239 | A1 | 2/2009 | Watanabe |
| 2011/0006336 | A1 | 1/2011 | Lee et al. |
| 2011/0018008 | A1 | 1/2011 | Lee |
| 2011/0205473 | A1 | 8/2011 | Oda |
| 2011/0221334 | A1 | 9/2011 | Kwon et al. |
| 2013/0016308 | A1 | 1/2013 | Urayama et al. |
| 2014/0042408 | A1 | 2/2014 | Akagawa et al. |
| 2014/0253856 | A1* | 9/2014 | Nakahata ................ H01L 33/08 438/34 |
| 2015/0014636 | A1* | 1/2015 | Kang ................ H10K 50/8428 438/26 |
| 2015/0041772 | A1 | 2/2015 | Han |
| 2015/0090991 | A1 | 4/2015 | Ishii et al. |
| 2015/0091030 | A1 | 4/2015 | Lee et al. |
| 2016/0285038 | A1 | 9/2016 | Kim |
| 2017/0115535 | A1 | 4/2017 | Matsushima et al. |

FOREIGN PATENT DOCUMENTS

| | | |
|---|---|---|
| JP | 2015-156389 | 8/2015 |
| KR | 10-2006-0116505 | 11/2006 |
| KR | 10-2007-0074828 | 7/2007 |
| KR | 10-2015-0104262 | 9/2015 |
| WO | 2006/077838 | 7/2006 |

* cited by examiner

FLEXIBLE DISPLAY APPARATUS

CROSS-REFERENCE TO RELATED APPLICATIONS

This is a continuation application of U.S. patent application Ser. No. 16/420,494, filed May 23, 2019, now U.S. Pat. No. 11,094,912, issued on Aug. 17, 2021, the disclosure of which is incorporated herein by reference in its entirety. U.S. patent application Ser. No. 16/420,494 is a continuation application of U.S. patent application Ser. No. 15/598,796, filed May 18, 2017, now U.S. Pat. No. 10,326,102, issued Jun. 18, 2019, the disclosure of which is herein by reference in its entirety. U.S. patent application Ser. No. 15/598,796 claims priority and benefit of Korean Patent Application No. 10-2016-0085073 under 35 U.S.C. § 119, filed on Jul. 5, 2016, the disclosure of which is incorporated herein by reference in its entirety for all purposes.

BACKGROUND

1. Field

One or more embodiments relate to a flexible display apparatus.

2. Description of the Related Art

Displays are used in a variety of electronic devices such as smart phones, laptop computers, digital cameras, camcorders, portable information terminals, notebook computers, tablet personal computers, watches, desktop computers, televisions, outdoor billboards, exhibition display apparatuses, dashboards, and head-up displays. Recently, flexible displays have been developed. These displays are easy to carry, have various shapes, and are largely based on organic light-emitting display technology. One flexible display is made from a plurality of films stacked in a laminating process. The films may be damaged during the laminating process and/or other manufacturing processes.

SUMMARY

In accordance with one or more embodiments, a flexible display apparatus includes a substrate including a display region having a plurality of pixels and a non-display region adjacent to the display region; a thin film encapsulation layer over the substrate; a plurality of spacers between the substrate and the thin film encapsulation layer and arranged around a pixel region; and at least one layer of a blocking dam in the non-display region, wherein a different arrangement of spacers are in a center region and an edge region of the display region, the different arrangement corresponding to at least one of a size and a number of the spacers.

The pixels may be in an entire region of the display region, at least one of the spacers may be arranged for each pixel, and the blocking dam may surround the display region. An area of the display region may decrease away from the center region toward the edge region, and an area of each spacer in one of the center region or the edge region may be greater than an area of each spacer in the other of the center region or the edge region. The area of each spacer in the edge region may be greater than the area of each spacer in the center region.

A total area of a plurality of spacers arranged consecutively in one line in the edge region of the display region may be equal to a total area of a plurality of spacers arranged consecutively in one line in the center region of the display region. A width of a portion of the blocking dam outside the edge region may be greater than a width of a portion of the blocking dam outside the center region of the display region. The larger-width portion of the blocking dam may be outside a region where the larger-area spacer is arranged. The area of each spacer in the center region and edge region may be greater than an area of each spacer in a region between the center region and edge region.

An area of the display region may decrease away from the center region toward the edge region, and a number of spacers in one of the center region or edge region may be greater than a number of spacers in the other of the center region and edge region. The number of spacers arranged in the edge region of the display region may be larger than the number of spacers arranged in the center region of the display region. A total number of spacers arranged consecutively in one line in the edge region may be equal to a total number of spacers arranged consecutively in one line in the center region.

The number of spacers in the center region and the edge region may be greater than a number of spacers in a region between the center region and the edge region. The blocking dam may include a plurality of blocking dams, and the blocking dams may be outside the display region and spaced apart from each other. At least one functional film among a polarization film, a touch sensing unit, or a cover window may be on a display panel including the substrate and the thin film encapsulation layer, and a region including larger-area spacers or a larger number of spacers may correspond to a region where a greater lamination pressure is applied than a region including smaller-area spacers or a smaller number of spacers when the display panel and the functional film are laminated.

A first pressure may be applied to the edge region, a second pressure may be applied to the center region, and the first pressure may be greater than the second pressure. A first pressure may be applied to the center region and edge region, and a second pressure may be applied to a region between the center region and edge region, the first pressure greater than the second pressure. The display region may be circular.

A thin film transistor may include a semiconductor active layer, a gate electrode, a source electrode, and a drain electrode, a display device may be connected to the thin film transistor, and at least one insulating layer may be between the thin film transistor and the display device over the substrate, and the spacer may corresponds to the insulating layer around a pixel region where the display device emits light. The blocking dam may be in a same layer as at least one of a first insulating layer covering a portion of the semiconductor active layer, a second insulating layer covering a portion of the gate electrode, a third insulating layer covering a portion of the drain electrode and the source electrode, a fourth insulating layer defining a pixel region where the display device is arranged, or a fifth insulating layer arranged around the pixel region.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
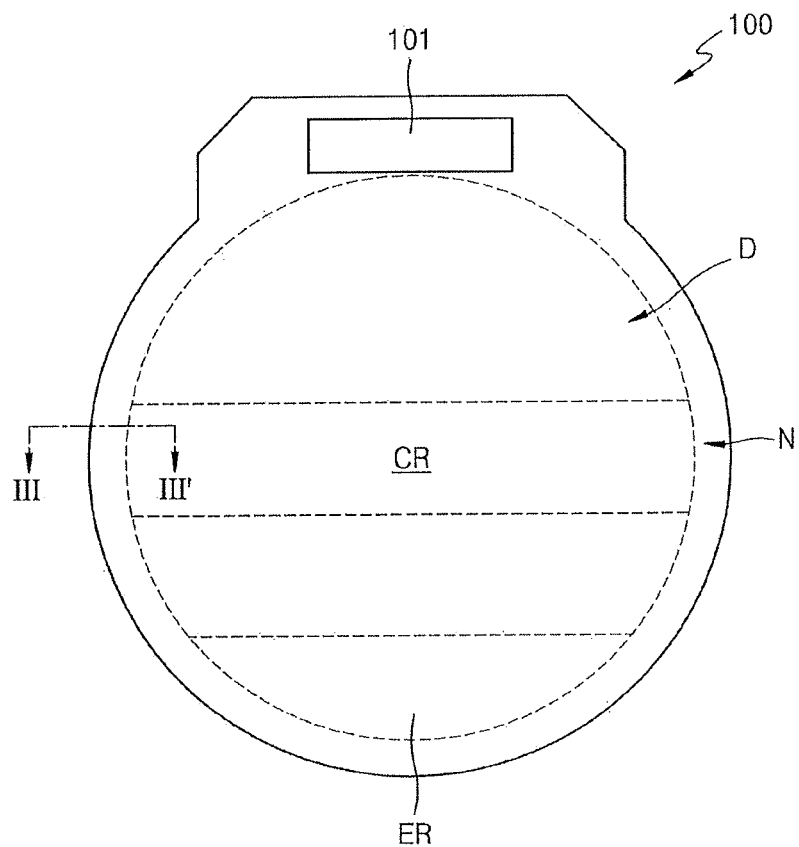
FIG. 1 illustrates an embodiment of a flexible display apparatus.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
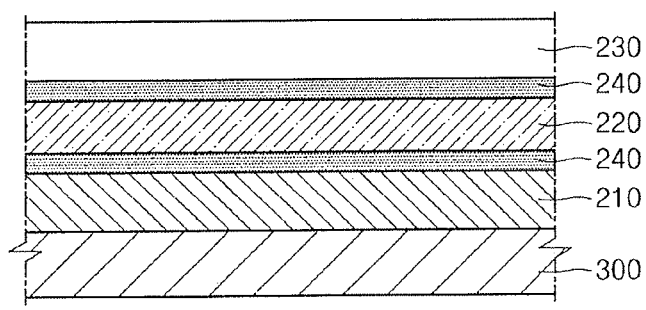
FIG. 2 illustrates a cross-sectional view of the flexible display apparatus.
Figure 3:
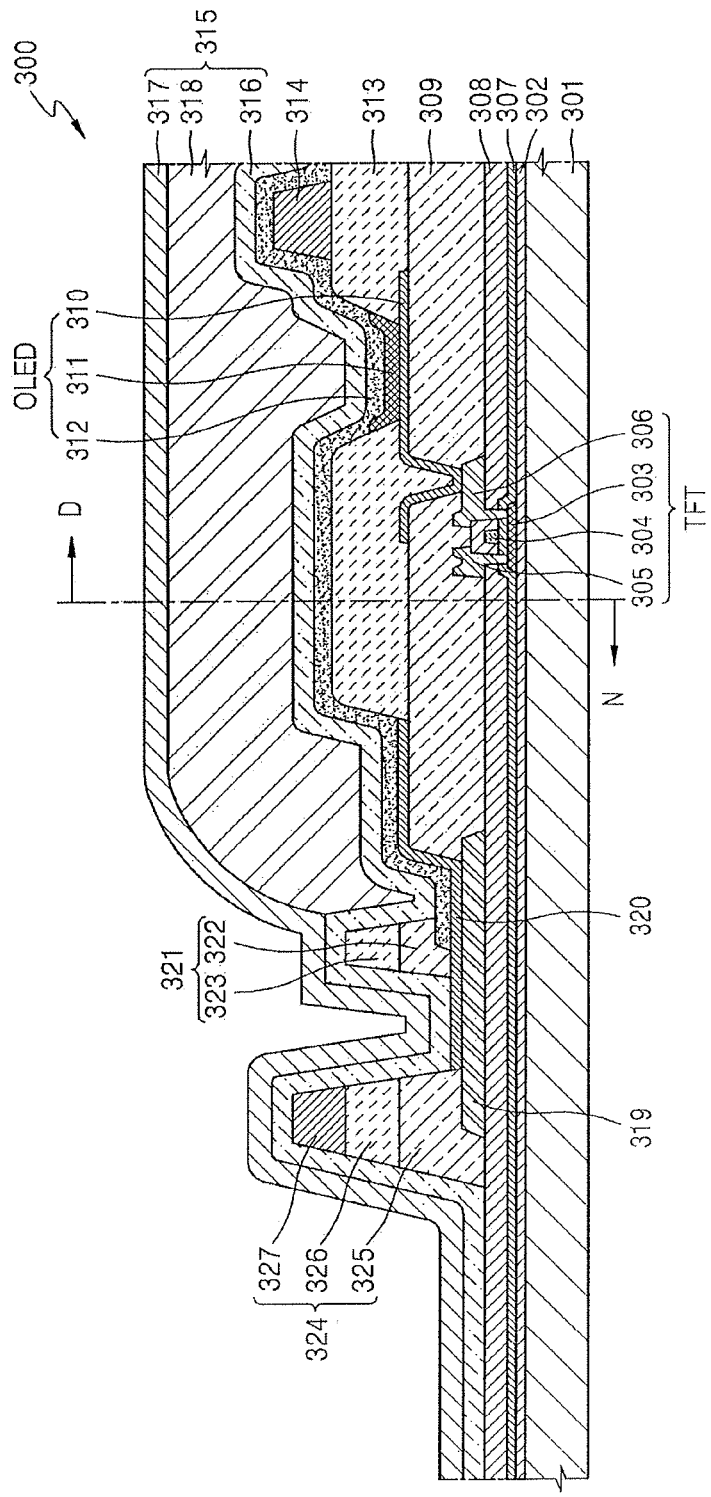
FIG. 3 illustrates a view taken along section line in FIG. 1.

FIG. 1 illustrates an embodiment of a flexible display apparatus 100. FIG. 2 illustrates a cross-sectional view of the flexible display apparatus 100. FIG. 3 illustrates a cross-sectional view taken along a line in FIG. 1.

Referring to FIGS. 1 to 3, the flexible display apparatus 100 may include a display panel 300 which may be bent. The flexible display apparatus 100 may be an organic light-emitting display apparatus. In another embodiment, the flexible display apparatus 100 may be a liquid crystal display, a field emission display, or an electronic paper display. The flexible display apparatus 100 may be a circular display apparatus (e.g., a watch) or may have another shape.

A plurality of functional films may be arranged on the display panel 300. For example, a polarization film 210 may be arranged on the display panel 300. A touch sensing unit 220 may be arranged over the polarization film 210. An adhesive layer 240 may be between the polarization film 210 and the touch sensing unit 220. The adhesive layer 240 may include an optical clear adhesive (OCA). A cover window 230 may be arranged over the touch sensing unit 220. An adhesive layer 240 may be between the touch sensing unit 220 and the cover window 230.

The display panel 300 may include a substrate 301 and a thin film encapsulation (TFE) layer 315 arranged over the substrate 301. The substrate 301 may include, for example, a glass substrate, a polymer substrate, or a flexible film. The substrate 301 may be transparent, opaque, or translucent (semitransparent) and may have flexibility. The substrate 301 may include, for example, polymer material such as polyimide, polycarbonate, polyethersulphone, polyethylene terephthalate, polyethylene naphthalate, polyarylate, and fiberglass reinforced plastic.

The substrate 301 may include a display region D including pixels and a non-display region N adjacent to display region D. The non-display region N may include a connection region 101 for communicating electrical signals with an external circuit.

A barrier layer 302 may be on the substrate 301 and may cover the top surface of the substrate 301. The barrier layer 302 may include an inorganic layer or an organic layer, and may include a single-layer structure or a multi-layer structure.

A thin film transistor TFT and an organic light-emitting device OLED (which is a display device connected electrically to the thin film transistor TFT) may be located over the substrate 301. The thin film transistor TFT may include a semiconductor active layer 303, a gate electrode 304, a source electrode 305, and a drain electrode 306. In the present embodiment, a top-gate type thin film transistor is illustrated as an example of the thin film transistor TFT. In another embodiment, the thin film transistor TFT may be a bottom-gate type.

The semiconductor active layer 303 may include an organic semiconductor, an inorganic semiconductor, or amorphous silicon. In one embodiment, the semiconductor active layer 303 may include an oxide semiconductor.

A gate insulating layer 307 may be on the semiconductor active layer 303. The gate insulating layer 307 may include an inorganic layer and/or may include a single-layer structure or a multi-layer structure.

A gate electrode 304 may be on the gate insulating layer 307 and may include a metal material with excellent conductivity. The gate electrode 304 may include a single-layer structure or a multi-layer structure.

An interlayer insulating layer 308 may be on the gate insulating layer 307 and may include an inorganic layer. The interlayer insulating layer 308 may insulate the gate electrode 304, the source electrode 305, and the drain electrode 306.

A source electrode 305 and a drain electrode 306 may be on the interlayer insulating layer 308. The source electrode 305 and the drain electrode 306 may contact a partial region of the semiconductor active layer 303. The source electrode 305 and the drain electrode 306 may include, for example, a single metal, an alloy, a metal nitride, a conductive metal oxide, or a transparent conductive material.

A planarization layer 309 may be on the thin film transistor TFT, may include an organic layer, and may be have a single-layer structure or a multi-layer structure. In an embodiment, the planarization layer 309 may include a composite stack of an inorganic insulating layer and an organic insulating layer.

An organic light-emitting device OLED may be on the planarization layer 309, and may include an intermediate layer 311 between a first electrode 310 and a second electrode 312. The first electrode 310 may be on the planarization layer 309 and may be electrically connected to the thin film transistor TFT. The first electrode 310 may function as an anode and may have various shapes. In an embodiment, the first electrode 310 may be patterned in the shape of an island.

The first electrode 310 may be a transparent electrode or a reflective electrode. When the first electrode 310 is a transparent electrode, the first electrode 310 may include a transparent conductive layer. When the first electrode 310 is a reflective electrode, the first electrode 310 may include a transparent conductive layer on a reflective layer.

A pixel definition layer 313 may be on the first electrode 310 and may include an organic layer or an inorganic layer. The pixel definition layer 313 may expose a portion of the first electrode 310. An intermediate layer 311 including an organic emission layer may be in an exposed region. The pixel definition layer 313 may define a pixel region of the organic light-emitting device OLED.

The intermediate layer 311 may include, for example, an organic emission layer. As another example, the intermediate layer 311 may include an organic emission layer and may further include at least one of a hole injection layer (HIL), a hole transport layer (HTL), an electron transport layer (ETL), or an electron injection layer (EIL). In an embodiment, the intermediate layer 311 may include an organic emission layer and may further include other functional layers.

The second electrode 312 may be on the intermediate layer 311. The second electrode 312 may function as a cathode and, for example, may be a common electrode. The second electrode 312 may be or include a transparent electrode or a reflective electrode. When the second electrode 312 is a transparent electrode, the second electrode 312 may include a conductive layer formed of low work function metals or a compound thereof and a transparent conductive layer on the conductive layer. When the second electrode 312 is a reflective electrode, the second electrode 312 may include a conductive layer formed of metals or a compound thereof.

A spacer 314 may be on the pixel definition layer 313 and may have a single-layer structure or a multi-layer structure that includes an organic material. The spacer 314 may be around the pixel region. The spacer 314 may consolidate the coupling of the substrate 301 and the thin film encapsulation layer 315. The spacer 314 may prevent display characteristics from being degraded by an external impact.

In an embodiment, a plurality of pixels may be arranged on/over the substrate 301. The pixels may emit light of a combination of colors, e.g., red, green, blue, and white, or a different combination of colors.

The pixel definition layer 313 and spacer 314 may be formed through a photo process or a photolithography process using photosensitive material. In an embodiment, the pixel definition layer 313 and the spacer 314 may be simultaneously formed by adjusting an exposure amount in an exposure process using a half-tone mask.

Various circuit patterns may be outside the display region D. The various circuit patterns may include, for example, a power supply pattern and an anti-static pattern may be arranged therein. A power line 319 may be on the interlayer insulating layer 308. The power line 319 may be, for example, a power voltage line to which external power is applied. The power line 319 may include the same material as the source electrode 305 and the drain electrode 306. In an embodiment, the power line 319 may have a three-layer structure of titanium (Ti)/aluminum (Al)/titanium (Ti). A circuit line 320 may be on the planarization layer 309. The planarization layer 309 may include the same material as the first electrode 310.

The power line 319 and the circuit line 320 may be arranged in different layers. A portion of the circuit line 320 may overlap the power line 319. One end of the second electrode 312 may be arranged on the circuit pattern 320.

The thin film encapsulation layer 315 may seal the display region D to prevent external oxygen and moisture from permeating into the display region D. The thin film encapsulation layer 315 may include at least one inorganic layer 316 and 317 and at least one organic layer 318. In an embodiment, a stack structure of insulating layers forming the thin film encapsulation layer 315 may be formed.

In the process of forming the organic layer 318 of the thin film encapsulation layer 315, a liquid organic material may flow into an undesired region of the substrate 301. In order to prevent this from happening, a plurality of blocking dams, for example, a first blocking dam 321 and a second blocking dam 324 may be arranged over the substrate 301. In another embodiment, a different number of blocking dams may block the flow of an organic material. At least one inorganic layer 316 and 317 of the thin film encapsulation layer 315 may cover the block dams 321 and 324.

The first blocking dam 321 and the second blocking dam 324 may be arranged around the display region D. The first blocking dam 321 and the second blocking dam 324 may be arranged to be spaced apart from each other.

The first blocking dam 321 may be over the power line 319. The first blocking dam 321 may include at least one layer, and may include a second dam portion 323 on a first dam portion 322. The first dam portion 322 and the second dam portion 323 may be stacked in the vertical direction of the substrate 301. The first dam portion 322 may be in the same layer as the planarization layer 309. The second dam portion 323 may be in the same layer as the pixel definition layer 313.

The second blocking dam 324 may be outside the first blocking dam 321 and may cover an outer edge of the power line 319. The second blocking dam 324 may include a first dam portion 325, a second dam portion 326 on the first dam portion 325, and a third dam portion 327 on the second dam portion 326. The first dam portion 325, the second dam portion 326, and the third dam portion 327 may be stacked in the vertical direction of the substrate 301. The first dam portion 325 may be in the same layer as the planarization layer 309. The second dam portion 326 may be in the same layer as the pixel definition layer 313. The third dam portion 327 may be in the same layer as the spacer 314.

In an embodiment, heights of the blocking dams may increase toward the edge of the substrate 301. For example, the height of the first blocking dam 321 may be greater than the height of the second blocking dam 324.

Because the first blocking dam 321 may block the flow of an organic material toward the edge of the substrate 301, the organic layer 318 may be located inside the first blocking dam 321. The inorganic layers 316 and 317 of the thin film encapsulation layer 315 may be wider than the organic layer 318. The inorganic layers 316 and 317 may cover an outside surface of the first blocking dam 321 and an outside surface of the second blocking dam 324.

The stack structure of the first blocking dam 321 and/or the second blocking dam 324 may have a different structure in another embodiment. For example, the first blocking dam 321 and the second blocking dam 324 may be in the same layer as at least one insulating layer among the gate insulating layer 307, the interlayer insulating layer 308, the planarization layer 309, the pixel definition layer 313, and/or the spacer 314.

In an embodiment, the first blocking dam 321 and the second blocking dam 324 may be at a different position in another embodiment. For example, the first blocking dam 321 and the second blocking dam 324 may be outside the power line 319.

The respective components of the flexible display apparatus 100 may be coupled to each other by a laminating process. For example, the display panel 300 and the polarization film 210 may be aligned and then attached to each other using a plurality of rollers. Also, the display panel 300 with the polarization film 210 attached thereto and the touch sensing unit 220 may be aligned and then attached to each other through a plurality of rollers.

In one embodiment, the flexible display apparatus 100 may be a circular display apparatus. Thus, in the laminating process, it may be difficult to apply uniform pressure throughout the entire region of the components attached to each other. For example, different pressures may be applied to the components along the traveling direction of a lamination roller.

For example, different pressures may be applied to respective regions of the circular display apparatus 100. According to one scenario, the smallest pressure may be applied to a center region CR of the display region D and the greatest pressure may be applied to an edge region ER of the display region D. Accordingly, a crack may form in the edge region ER of the display region D, for example, due to an external impact.

The crack may occur mainly in the spacer 314 in the display region D. For example, the crack may occur in the first blocking dam 321 and the second blocking dam 324 in the non-display region N surrounding the display region D. In accordance with one embodiment, the areas of the spacer 314, the first blocking dam 321, and the second blocking dam 324 may be applied with uniform roller pressure in the display apparatus 100.

Figure 4:
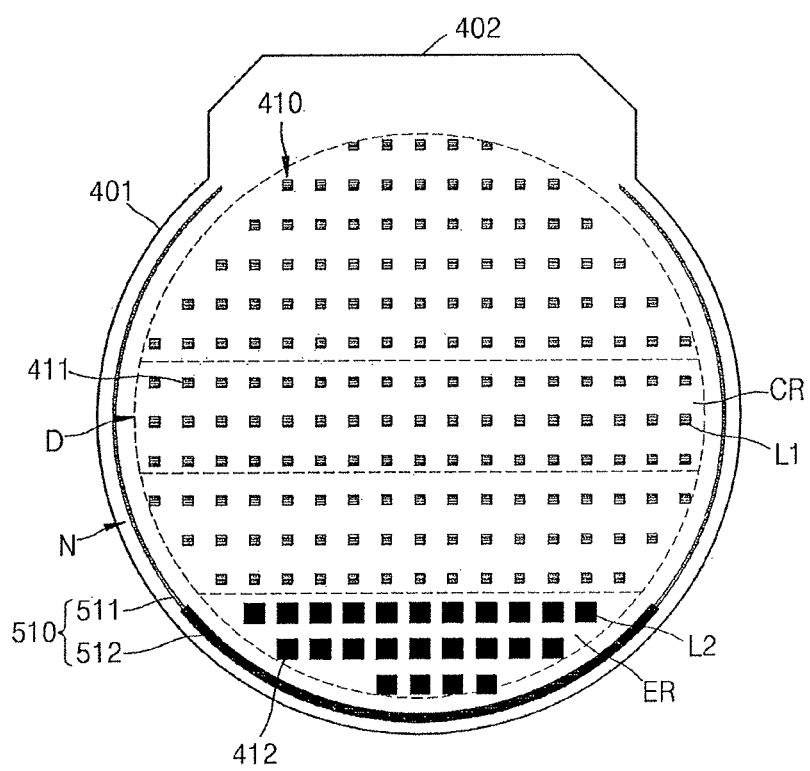
FIG. 4 illustrates an embodiment of a spacer and a blocking dam.
Figure 5A:
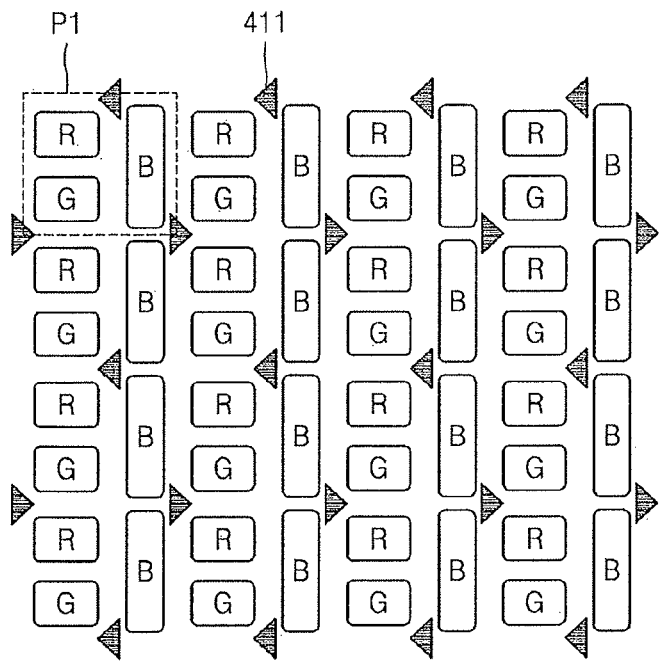
FIG. 5A illustrates an embodiment of first pixels in a display region.

FIG. 4 illustrates an embodiment of a spacer 410 and a blocking dam 510 on/over a substrate 401. FIG. 5A is an enlarged plan view of a plurality of first pixels P1 in a center region CR of a display region D in FIG. 4, and FIG. 5B illustrates an enlarged plan view of a plurality of second pixels P2 in an edge region ER of the display region D in FIG. 4.

Figure 5B:
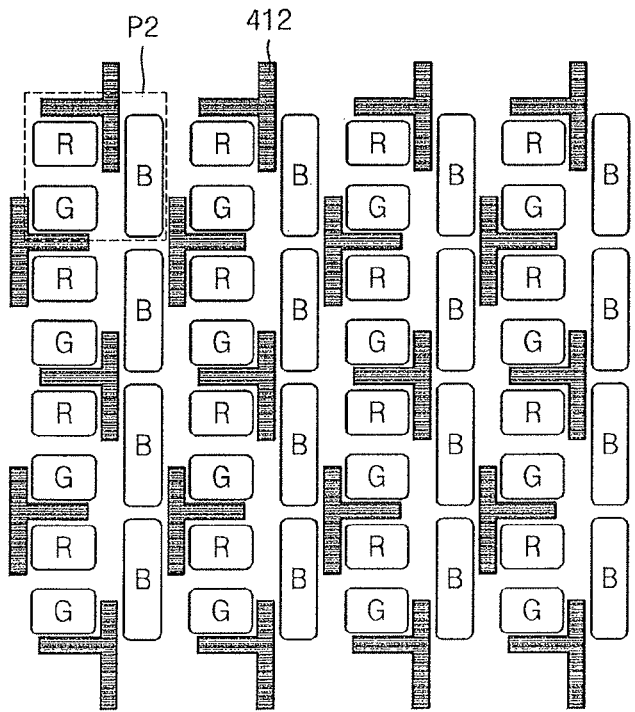
FIG. 5B illustrates an embodiment of second pixels in the display region.

Referring to FIGS. 4, 5A, and 5B, the substrate 401 may have a circular shape or another shape. A connection region 402 for communicating electrical signals with an external circuit may extend on one side of the substrate 401. The substrate 401 may include a display region D where a plurality of pixels are arranged and a non-display region N outside the display region D. The display region D may have, for example, a circular shape or another shape. The non-display region N may surround the display region D.

The display region D may include a plurality of pixels P1 and P2 arranged throughout the entire region of the display region D. A plurality of pixels P1 arranged in the center region CR of the display region D and a plurality of pixels P2 arranged in the edge region ER of the display region D may or may not be in the same pixel array. The respective pixels P1 and P2 may include a red subpixel R, a green subpixel G, and a blue subpixel B and may be arranged repeatedly throughout the entire region of the display region D.

The center region CR may be a region that is pressed by the lamination roller at the center of the display region D, when the lamination roller rolls in the opposite direction from the connection region 402 of the substrate 401. The edge region ER may be a region where rolling is completed on the opposite side of the connection region 402 after the lamination roller passes the center region CR.

At least one of a plurality of spacers 410 may be arranged for each pixel P1 or P2. A first spacer 411 may be arranged for each first pixel P1 in the center region CR of the display region D.

A second spacer 412 may be arranged for each second pixel P2 in the edge region ER of the display region D. Each of the first spacer 411 and the second spacer 412 may be arranged in at least one of the region between the red subpixel R and the green subpixel G, the region between the green subpixel G and the blue subpixel B, or the region between the blue subpixel B and the red subpixel R.

The first spacer 411 in the center region CR of the display region D may have a triangular shape between adjacent ones of the red subpixel R, the green subpixel G, and/or the blue subpixel B. The shape of the first spacer 411 may be different in another embodiment, e.g., a tetragonal shape, a circular shape, or an elliptical shape.

The second spacer 412 in the edge region ER of the display region D may be between adjacent ones of the red subpixel R, the green subpixel G, and/or the blue subpixel B, and may have a shape surrounding at least a portion of one of the red subpixel R, the green subpixel G, or the blue subpixel B. The shape of the second spacer 412 may be different in another embodiment, e.g., a wave shape, a belt shape, or a zigzag shape.

In the present embodiment, each of the spacers 410 is arranged for each first pixel P1 and for each second pixel P2. In another embodiment, a plurality of first spacers 411 and a plurality of second spacers 412 may be arranged between a red subpixel R and green subpixel G, between a green subpixel G and blue subpixel B, and between a blue subpixel B and red subpixel R.

In another embodiment, each of the first spacer 411 and the second spacer 412 may surround a portion of the red subpixel R, a portion of the green subpixel G, and a portion of the blue subpixel B.

When the display region D is circular, the area of the display region D may decrease away from the center region CR toward the edge region ER. The area of each spacer 410 in one of the center region CR or the edge region ER of the display region D may be greater than the area of each spacer 410 in the other one of the center region CR or the edge region ER of the display region D.

In the present embodiment, the area of the second spacer 412 in the edge region ER of the display region D may be greater than the area of the first spacer 411 in the center region CR of the display region D.

Thus, in the laminating process, the area of each second spacer 412 in the edge region ER of the display region D where the greatest pressure is applied may be greater than the area of each first spacer 411 in the center region CR of the display region D where the least pressure is applied. The greatest pressure may be applied to the second spacer 412 in the edge region ER.

In an embodiment, the total area of the spacers 410 in each line of the display region D may be uniform throughout the entire region of the display region D. For example, the total area of a plurality of second spacers 412 arranged consecutively in a line L2 in the edge region ER of the display region D may be equal to the total area of a plurality of first spacers 411 arranged consecutively in a line L1 in the center region CR of the display region D. In order to apply uniform pressure throughout the entire region of the display region D, the total area of a plurality of spacers 410 arranged consecutively in each line of the display region D may be uniform.

A blocking dam 510 may be in the non-display region N and may surround the display region D. The area of one of a first portion 511 of the blocking dam 510 outside the center region CR of the display region D or a second portion 512 of the blocking dam 510 around the edge region ER of the display region D may be greater than the area of the other one of the first portion 511 or the second portion 512.

In the present embodiment, the width of a second portion 512 of the blocking dam 510 outside the edge region ER of the display region D may be greater than the width of a first portion 511 of the blocking dam 510 outside the center region CR of the display region D.

The second portion 512 of the blocking dam 510 having a relatively large area may correspond to a region in which rolling of the lamination roller is completed where the greatest pressure is applied in the lamination process. A region where the second portion 512 of the blocking dam 510 is arranged may correspond to a region outside the edge region ER of the display region D where the second spacer 412 is arranged.

In the circular display apparatus having the above structure, uniform pressure may be applied throughout the entire region during the process of laminating different components. Thus, a crack caused by an external impact may be prevented in the edge region ER of the display region D where the greatest pressure is applied. In an embodiment, the area of each spacer 410 may increase gradually as the pressure of the lamination roller increases away from the center region CR of the display region D toward the edge region ER of the display region D.

Figure 6:
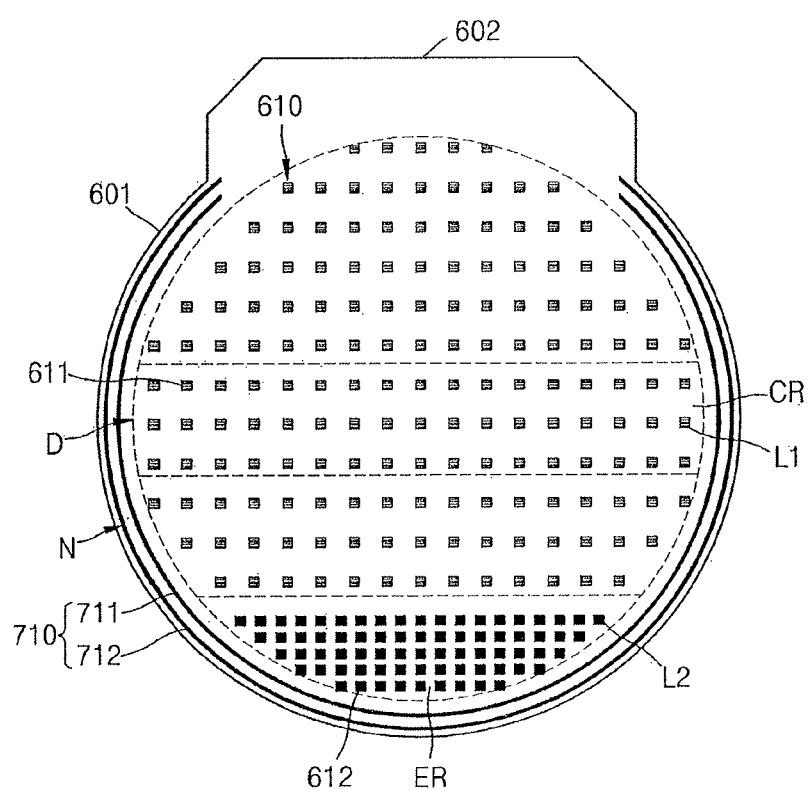
FIG. 6 illustrates another embodiment of a spacer and a blocking dam.
Figure 7A:
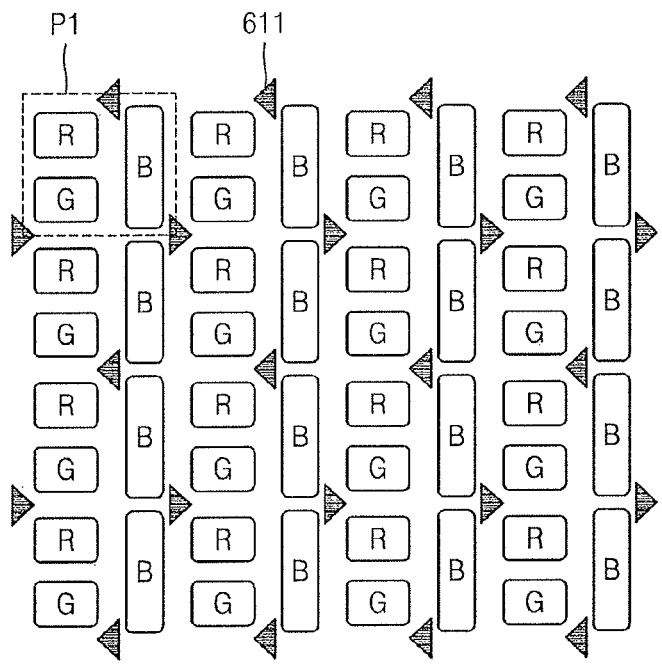
FIG. 7A illustrates first pixels in a display region and FIG. 7B illustrates second pixels in the display region according to another embodiment.
Figure 7B:
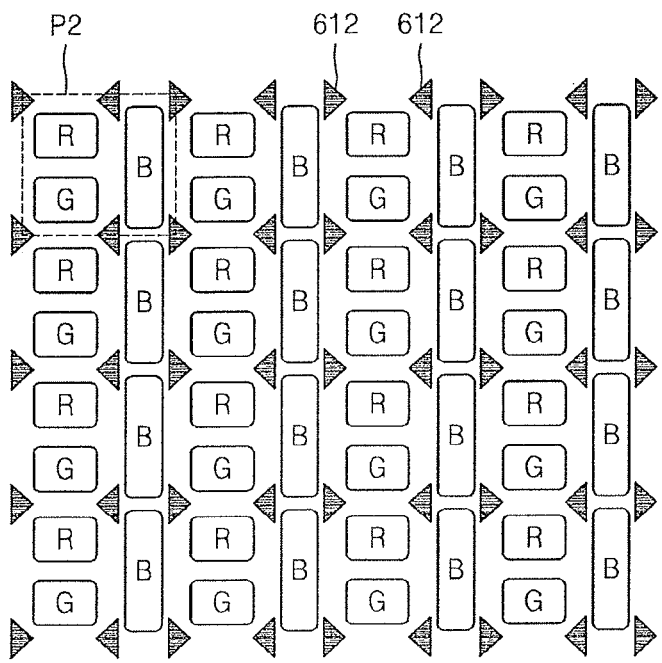

FIG. 6 illustrates another embodiment of a spacer 610 and a blocking dam 710 on/over a substrate 601. FIG. 7A illustrates an enlarged plan view of a plurality of first pixels P1 in a center region CR of a display region D in FIG. 6. FIG. 7B illustrates an enlarged plan view of a plurality of second pixels P2 in an edge region ER of the display region D in FIG. 6.

Referring to FIGS. 6, 7A, and 7B, the substrate 601 may be a circular substrate. A connection region 602 for communicating electrical signals with an external circuit may be on one side of the substrate 601. The substrate 601 may include a display region D having a plurality of pixels and a non-display region N adjacent to the display region D. The display region D may be circular, and the non-display region N may surround the display region D. The display region D may include a plurality of pixels P1 and P2.

At least one of a plurality of spacers 610 may be arranged for each pixel P1 or P2. A first spacer 611 may be arranged for each first pixel P1 in the center region CR of the display region D. A second spacer 612 may be arranged for each second pixel P2 in the edge region ER of the display region D. Each of the first spacer 611 and the second spacer 612 may be arranged in at least one of the region between the red subpixel R and the green subpixel G, the region between the green subpixel G and the blue subpixel B, or the region between the blue subpixel B and the red subpixel R.

The center region CR of the display region D may be a region that is pressed by the lamination roller at the center of the display region D when the lamination roller rolls in the opposite direction from the connection region 602 of the substrate 601. The edge region ER may be a region where rolling is completed on the opposite side of the connection region 602 after the lamination roller passes the center region CR.

Since the display region D is circular, the area of the display region D may decrease in a direction away from the center region CR toward the edge region ER. The number of spacers 610 in one of the center region CR or the edge region ER of the display region D may be greater than the number of spacers 610 in the other one of the center region CR or the edge region ER of the display region D.

In the present embodiment, the number of second spacers 612 in the edge region ER of the display region D may be greater than the number of first spacers 611 in the center region CR of the display region D. Thus, in the laminating process, the number of second spacers 612 in the edge region ER of the display region D where the greatest pressure is applied may be larger than the number of first spacers 611 in the center region CR of the display region D where the least pressure is applied. The greatest pressure may be applied to the second spacer 612 in the edge region ER.

The total number of spacers 610 in each line of the display region D may be uniform throughout the entire region of the display region D. For example, the total number of second spacers 612 arranged consecutively in line L2 in the edge region ER of the display region D may be equal to the total number of first spacers 611 arranged consecutively in line L1 in the center region CR of the display region D.

In an embodiment, the number of spacers 610 may increase gradually according to the pressure of the lamination roller increasing away from the center region CR of the display region D toward the edge region ER of display region D. As in the embodiment of FIG. 4, the areas of spacers 610 may also be different between the center region CR and the edge region ER of the display region D.

A blocking dam 710 may be in the non-display region N and may surround the display region D. The blocking dam 710 may include a plurality of blocking dams, for example, a first blocking dam 711 and a second blocking dam 712. The blocking dam 710 may include a different number of blocking dams in another embodiment. The first blocking dam 711 may be outside the display region D. The second blocking dam 712 may be outside the first blocking dam 711 and spaced apart from first blocking dam 711.

Figure 8:
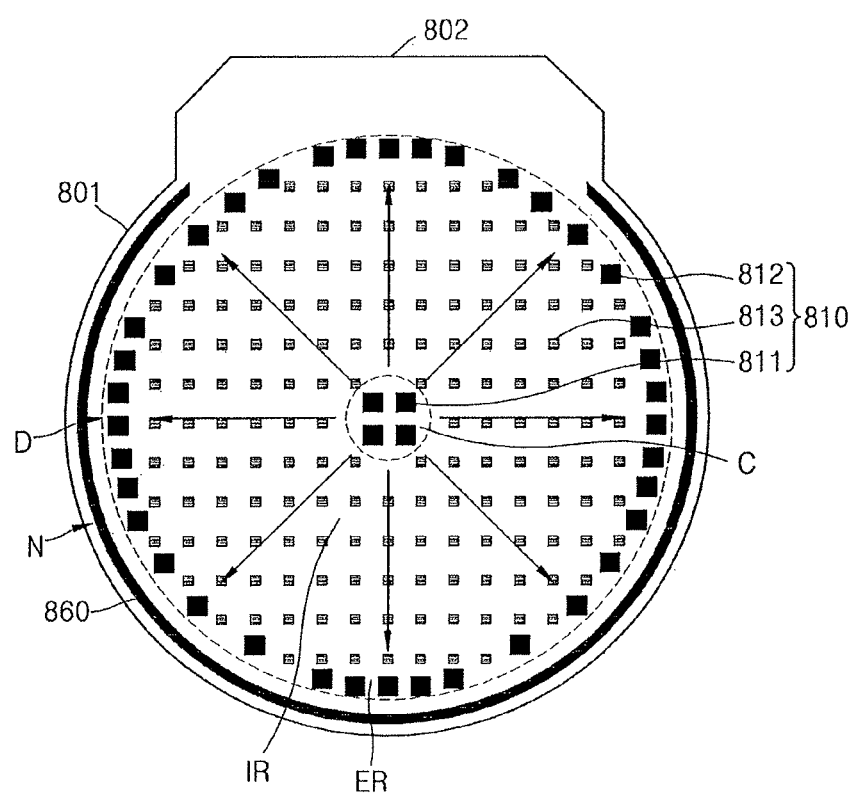
FIG. 8 illustrates another embodiment of a spacer and a blocking dam.

FIG. 8 illustrates another embodiment of a spacer 810 and a blocking dam 860 on/over a substrate 801. Referring to FIG. 8, the substrate 801 may be a circular substrate. A connection region 802 for communicating electrical signals with an external circuit may be arranged on one side of the substrate 801. The substrate 801 may include a display region D including a plurality of pixels and a non-display region N adjacent to the display region D. The display region D may be circular and may surround the display region D. A plurality of spacers 810 may be in the entire region of the display region D.

In the embodiments of FIGS. 4 and 6, in the process of laminating different components using the lamination roller, rolling is performed in the opposite direction from the connection regions 402 and 602 of the substrates 401 and 601. In the present embodiment, different components may be laminated by pressing radially on the substrate 801 (as indicated by an arrow) using a mold having a certain elasticity.

In this case, a region where the greatest pressure is applied may be a center C of the display region D and an edge region ER of the display region D. The edge region ER of the display region D may be the circumference of the display region D. A region where the least pressure is applied may be a region IR between the center C and the edge region ER of the display region D.

A plurality of first spacers 811 may be at the center C of the display region D. A plurality of second spacers 812 may be in the edge region ER of the display region D. A plurality of third spacers 813 may be in the region IR between the center C and the edge region ER of the display region D.

The area of each first spacer 811 at the center C of the display region D and the area of each second spacer 812 in the edge region ER of the display region D may be greater than the area of each third spacer 813 in the region IR between the center C and the edge region ER of the display region D. A region where the first spacer 811 and the second spacer 812 are arranged may be a region where the greatest pressure is applied in the lamination process.

A blocking dam 860 may be in the non-display region N and may surround the display region D. The width of the blocking dam 860 may be greater than the width of the first portion 511 of the blocking dam 510 of FIG. 4 and may correspond to the width of the second portion 512 of the blocking dam 510. Since the greatest pressure is applied along the circumference of the display region D, the total width of the blocking dam 860 may be formed to be large.

Figure 9:
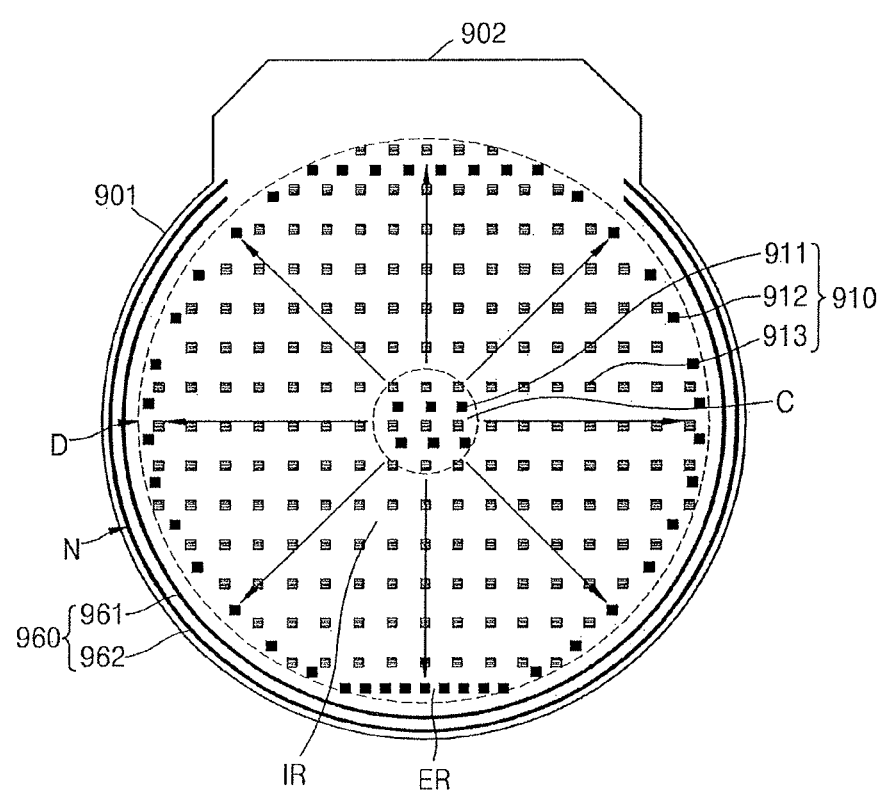
FIG. 9 illustrates another embodiment of a spacer and a blocking dam.

FIG. 9 illustrates another embodiment of a spacer 910 and a blocking dam 960 on/over a substrate 901. Referring to FIG. 9, the substrate 901 may be circular. A connection region 902 for communicating electrical signals with an external circuit may be arranged on one side of the substrate 901. The substrate 901 may include a display region D including a plurality of pixels and a non-display region N adjacent to the display region D. The display region D may be circular, and the non-display region N may surround the display region D.

A plurality of spacers 910 may be in the entire region of the display region D. In the present embodiment, in the laminating process, a mold having a certain elasticity may be used to press radially on the substrate 901. Accordingly, a region where a relatively great pressure is applied may be a center C of the display region D and an edge region ER of the display region D. On the other hand, a relatively small pressure may be applied to a region IR between the center C and the edge region ER of the display region D.

A plurality of first spacers 911 may be at the center C of the display region D. A plurality of second spacers 912 may be in the edge region ER of the display region D. A plurality of third spacers 913 may be between the center C and the edge region ER of the display region D. The number of first spacers 911 at the center C of the display region D and the number of second spacers 912 in the edge region ER of the display region D may be greater than the number of third spacers 913 in the region IR between the center C and the edge region ER of the display region D. A region where the first spacers 911 and the second spacers 912 are arranged may be a region where the greatest pressure is applied in the lamination process.

A blocking dam 960 may be in the non-display region N and may surround the display region D. The blocking dam 960 may include a first blocking dam 961 and a second blocking dam 962. The first blocking dam 961 may be outside the display region D. The second blocking dam 962 may be outside the first blocking dam 961 and spaced apart from the first blocking dam 961.

In accordance with one or more embodiments, spacers having different sizes are arranged in a display region. As a result, a laminating process may apply uniform pressure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A flexible display apparatus, comprising:
   a substrate including a display region and a non-display region surrounding the display region, the display region having a plurality of pixels, each of the plurality of pixels including a light emitting diode;
   a thin film encapsulation layer over the substrate; and
   at least one functional film is directly over the thin film encapsulation layer that is laminated to the substrate, wherein
   the display region includes
   a first region, wherein pixels and first spacers between the substrate and the thin film encapsulation layer are arranged in the first region;
   a second region that does not overlap the first region, wherein pixels and second spacers between the substrate and the thin film encapsulation layer are arranged in the second region, the second region being capable of enduring a greater lamination pressure as compared to the first region due to at least one difference of a shape, a size and a number between the second spacers and the first spacers, and
   a blocking dam in the non-display region, wherein the blocking dam includes a first portion located between the first region and an outer edge of the substrate and a second portion located between the second region and the outer edge of the substrate as observed from plan view.

2. The flexible display apparatus as claimed in claim 1, wherein
   the first portion of the blocking dam have a first width as observed from plan view and the second portion of the blocking dam have a second width greater than the first width as observed from plan view, wherein
   the second portion does not overlap the first portion as observed from plan view.

3. The flexible display apparatus as claimed in claim 1, wherein:
   the pixels are in an entire region of the display region.

4. The flexible display apparatus as claimed in claim 1, wherein each of the second spacers has a greater area than each of the first spacers as seen from plan view.

5. The flexible display apparatus as claimed in claim 1, wherein the second spacers have a greater numeric density than the first spacers as seen from plan view.

6. The flexible display apparatus as claimed in claim 1, wherein:
   the display region includes a center that includes pixels and third spacers, and
   each third spacer has an area greater than each first spacer as seen from plan view.

7. The flexible display apparatus as claimed in claim 1, wherein:

each pixel includes a respective thin film transistor,
each thin film transistor includes a semiconductor active layer, a gate electrode, a source electrode, and a drain electrode,
at least one insulating layer is between the thin film transistor and a display device over the substrate, and
each spacer corresponds to the insulating layer around a pixel region where the display device emits light.

8. The flexible display apparatus as claimed in claim 7, wherein
the blocking dam in a same layer as at least one of a first insulating layer covering a portion of the semiconductor active layer;
a second insulating layer covers a portion of the gate electrode; and
a third insulating layer covers a portion of the drain electrode and the source electrode.

9. The flexible display apparatus as claimed in claim 1, wherein
the first region is a center region of the display region;
the second region is an edge region of the display region; and
the blocking dam includes a first blocking dam and a second blocking dam parallel to the first blocking dam, wherein the first blocking dam and the second blocking dam at least partially surround the display region,
wherein
the second portion does not overlap the first portion as observed from plan view.

10. The flexible display apparatus as claimed in claim 1, wherein two adjacent second spacers have an identical shape but a different orientation.

11. The flexible display apparatus as claimed in claim 1, wherein two adjacent first spacers have an identical shape but a different orientation.

12. The flexible display apparatus as claimed in claim 1, wherein
the first region is a center region of the display region, and
the second region is located between the first region and an outer edge of the display region.

13. The flexible display apparatus as claimed in claim 12, wherein
the display region is circular, and
the second region has a D-shape and does not completely surrounds the first region.

14. The flexible display apparatus as claimed in claim 13, wherein
the first portion of the blocking dam have a first width as observed from plan view and the second portion of the blocking dam have a second width greater than the first width as observed from plan view, and
wherein each of the second spacers has a greater area than each of the first spacers as seen from plan view.

15. The flexible display apparatus as claimed in claim 13, wherein
the blocking dam includes a first blocking dam and a second blocking dam parallel to the first blocking dam as observed from plan view,
wherein the second spacers have a greater numeric density than the first spacers as seen from plan view.

16. A flexible display apparatus, comprising:
a substrate including a display region and a non-display region surrounding the display region, the display region having a plurality of pixels; and
a thin film encapsulation layer over the substrate; and
at least one functional film is directly over the thin film encapsulation layer that is laminated to the substrate, wherein
the display region includes
a first region, wherein pixels and first spacers between the substrate and the thin film encapsulation layer are arranged in the first region;
a second region that does not overlap the first region, wherein pixels and second spacers between the substrate and the thin film encapsulation layer are arranged in the second region; and
a third region between the first region and the second region, wherein pixels and third spacers between the substrate and the thin film encapsulation layer are arranged in the third region, wherein
the first region is a center region of the display region, the third region surrounds the first region and the second region surrounds the third region,
the first region and the second region are capable of enduring a greater lamination pressure as compared to the third region due to at least one difference of a shape, a size and a number between the first spacers and the third spacers and between the second spacers and the third spacers, and
the flexible display apparatus further comprising a blocking dam in the non-display region, the blocking dam at least partially surrounding the second region of the display region.

17. The flexible display apparatus as claimed in claim 16, wherein the blocking dam includes a first blocking dam and a second blocking dam parallel to the first blocking dam.

* * * * *